United States Patent [19]
Yero

[11] Patent Number: 5,986,937
[45] Date of Patent: Nov. 16, 1999

[54] MEMORY READ CIRCUIT WITH PRECHARGING LIMITATION DEVICE

[75] Inventor: Emilio Miguel Yero, Aix-En-Provence, France

[73] Assignee: SGS-Thomson Microelectronics S.A., Gentilly, France

[21] Appl. No.: 09/059,231

[22] Filed: Apr. 13, 1998

[30] Foreign Application Priority Data

Apr. 16, 1997 [FR] France .................................. 97 04926

[51] Int. Cl.$^6$ .................................................. G11C 16/06
[52] U.S. Cl. .............................. 365/185.21; 365/185.2; 365/205
[58] Field of Search .......................... 365/185.21, 185.2, 365/205; 327/53

[56] References Cited

U.S. PATENT DOCUMENTS

| | | | |
|---|---|---|---|
| 5,091,888 | 2/1992 | Akaogi | 365/185.21 |
| 5,198,997 | 3/1993 | Arakawa | 365/185.21 |
| 5,206,552 | 4/1993 | Iwashita | 327/53 |
| 5,258,959 | 11/1993 | Dallabora et al. | 365/210 |
| 5,353,249 | 10/1994 | Itano | 365/185.25 |
| 5,675,535 | 10/1997 | Jinbo | 365/185.2 |

FOREIGN PATENT DOCUMENTS

| | | |
|---|---|---|
| 3934894 A1 | 4/1990 | Germany . |
| 94/28549 | 12/1994 | WIPO . |

*Primary Examiner*—David Nelms
*Assistant Examiner*—Hoai V. Ho
*Attorney, Agent, or Firm*—Allen, Dyer, Doppelt, Milbrath & Gilchrist, P.A.

[57] ABSTRACT

Disclosed is a memory read circuit with a device to limit the precharging of the bit lines. The circuit includes a portion forming a current mirror and providing furthermore for a controlled precharging of the bit line and of the reference line in limiting the precharging potential to a borderline value referenced with respect to the ground. The circuit may be applied to non-volatile (EEPROM, Flash EPROM) memories, and especially memories supplied with low voltages.

27 Claims, 2 Drawing Sheets

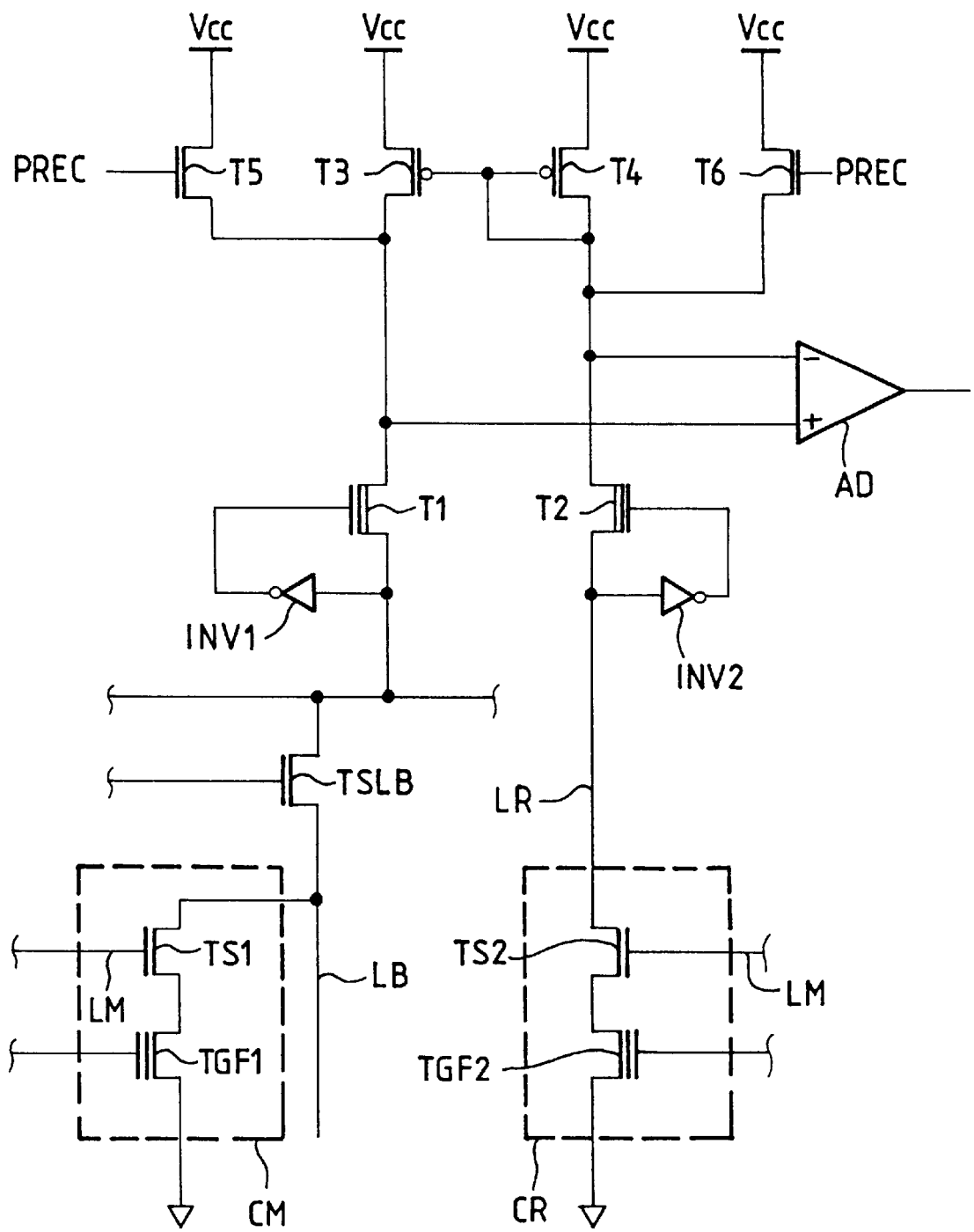
FIG_1
(PRIOR ART)

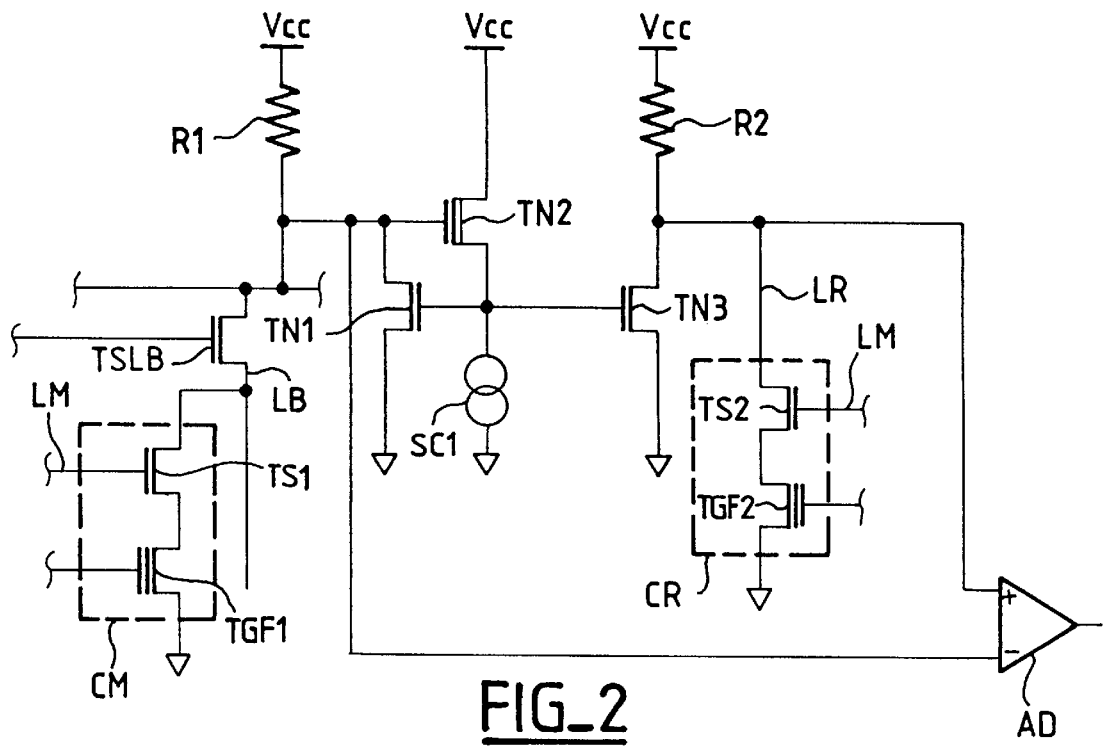
FIG_2
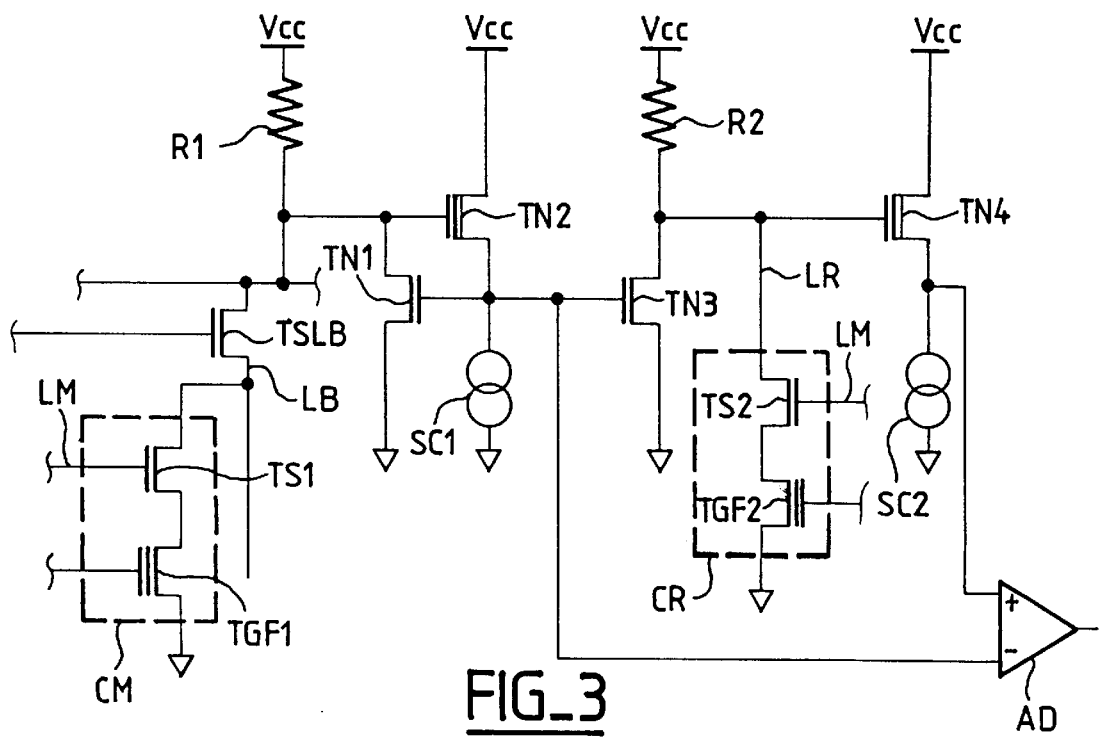
FIG_3

MEMORY READ CIRCUIT WITH PRECHARGING LIMITATION DEVICE

FIELD OF THE INVENTION

The present invention relates to memories, and, more particularly, to a memory read circuit with a device to limit the precharging of the bit lines. It can be applied in the field of non-volatile memories (EEPROMs and flash EPROMs) and relates especially to memories supplied with low voltages.

BACKGROUND OF THE INVENTION

Memories are organized in arrays of cells, cells of one and the same column being connected to a bit line and the cells of one and the same row being connected to a word line. The bit line is used to transmit information on the state of a memory cell located at the intersection of this bit line and a selected word line. This information is then processed by a read circuit to determine the state of the memory cell.

In an EEPROM memory, the cells may be in a blank state in which they let through a reference electrical current, an erased state in which they let through a current greater than the reference current or a programmed state in which they counter the passage of a current. To read the information, it is sought to detect the presence of a current flowing in the bit line connected to the cell to be read: a current of this kind is present if the cell is erased or blank. Otherwise it is programmed.

To detect the presence of the current, a reference line similar to the bit line is used. This reference line is crossed by the reference current during a reading phase. This reference current may be provided, for example, by a reference cell. The phase for the reading of a memory cell is preceded by a phase for the precharging of the bit line and the reference line. During this phase, the bit line and the reference line are precharged at a potential of about 1 volt. This potential is limited to 1 volt to prevent any stress on the cells connected to the bit line. During the reading phase, the current flowing in the bit line is compared with the reference current to find out whether the cell read is programmed or erased.

FIG. 1 gives a simplified view of a prior art read circuit. A memory cell CM located at the intersection of a word line LM and a bit line LB is selected by the word line and delivers a piece of information on the bit line. In a conventional way, the memory cell CM includes a floating-gate transistor TGF1 series-connected with a selection transistor TS1. The control gate of the selection transistor TS1 is connected to the word line LM, while the control gate of the transistor TGF1 receives a read voltage during the reading phase. The bit line LB is selected by a bit line selection transistor TSLB. The bit line LB is precharged in voltage during a precharging phase by a precharging transistor T1 which has the function of providing a precharging current to the bit line, while limiting the precharging potential to a determined value of about 1 volt.

A reference line LR whose characteristics are very similar to those of the bit line LB, especially from the viewpoint of the parasitic capacitance, is also precharged at a potential of about 1 volt by a precharging transistor T2. In the example of FIG. 1, the reference line LR is connected to a reference cell CR provided by a selection transistor TS2 series-connected with a floating-gate transistor TGF2.

During the reading phase, a read voltage is applied to the control gate of the transistor TGF2 and the reference line is then crossed by a reference current.

To limit the precharging of the bit line LB and the reference line LR to 1 volt, the transistors T1 and T2 are looped to themselves by inverter gates INV1 and INV2. Thus, the source and the control gate of the transistor T1 are respectively connected to the input and the output of the inverter gate INV1. Similarly, the source and the control gate of the transistor T2 are respectively connected to the input and to the output of the inverter gate INV2. These four elements then form a device to limit the precharging of the lines LB and LR. To obtain the desired precharging potential, the size of the transistors of the inverter gate is determined as a function of the equivalent capacitance of the bit line and of the reference line.

To read the state of the cells, a comparison is made between the current consumed by the bit line and the reference current. More specifically, the current consumed by the bit line is compared with a current that is a fraction of the current consumed by the reference cell.

To do this, the drains of the transistors T1 and T2 are supplied by the two arms of a current mirror having a copying ratio k smaller than 1. The first arm of the mirror has a copying transistor T3 and the second arm has a reference transistor T4. The copying transistor T3 tends to copy the current flowing in the reference transistor T4. Conventionally, the copying ratio is equal to 1/2.

The copying transistor T3 is a P type transistor having its source connected to a supply terminal Vcc and its drain is connected to the drain of a transistor T1. The reference transistor T4 is, in the same way, a P type transistor whose source is connected to the supply terminal Vcc and whose drain is connected to the drain of the transistor T2. The control gates of the transistors T3 and T4 are connected to each other and the gate of the transistor T4 is connected to its drain.

A differential amplifier AD has its inputs connected to the drains of the transistors T3 and T4 and measures the difference between the potentials at these two drains. This difference is zero if the currents flowing in the transistors T3 and T4 have a ratio equal to k. The output of the amplifier AD gives a signal indicating whether the ratio between the currents is greater than k or smaller than k.

The read circuit may have two supplementary transistors T5 and T6 added to it. These transistors T5 and T6 are designed to accelerate the precharging of the bit line and the reference line. These transistors are controlled by a precharging signal PREC that is active during the precharging phase and enables the application of a voltage close to the supply voltage to the drains of the precharging transistors T1 and T2 during the precharging phase.

The main drawback of this type of circuit is that the operation of the precharging limitation device provided by the transistors T1, T2 and the inverters INV1, INV2 is never satisfactory when the supply voltage of the read circuit is low, in the range of 1.8 volts. Indeed, with a maximum voltage (1.8 volts) that is lower at their control gate, the transistors T1 and T2 are less conductive and the control of the current and of the precharging potential becomes less precise. The time taken to precharge the bit line is thereby penalized. Furthermore, since the drain-source voltage of the transistors T1 and T2 is relatively low, their action on the bit line and the reference line is never completely controlled.

It is possible to consider modifying the characteristics of the transistors of the cells of the memory to reduce the borderline value of the precharging potential of the bit lines which is 1 volt.

This approach would make it necessary however to qualify a new technology. This is particularly lengthy and costly.

It is also possible to use large precharging transistors T1 and T2 so that they let through more current and reduce the precharging duration. However, the drain-source voltage of the transistors T1 and T2 would remain the same.

SUMMARY OF THE INVENTION

Thus, an object of the invention is a read circuit for a non-volatile memory of the type comprising a matrix of memory cells, the read circuit being connected, firstly, to the memory cells by means of at least one bit line and, secondly, to a reference current generator by means of a reference line. The read circuit also comprises a differential amplifier to deliver a signal representing the state of a memory cell selected from among the memory cells of the matrix. The circuit preferably further comprises means forming a current mirror and providing for a controlled precharging of the bit line and of the reference line in limiting the precharging potential to a borderline value referenced with respect to ground. Preferably, the reference current generator is a reference memory cell.

According to a first embodiment of the invention, the means forming a current mirror and providing for controlled precharging comprise:
    a first resistive element connected between a supply terminal and the bit line,
    a second resistive element connected between the supply terminal and the reference line,
    a first N type transistor whose drain is connected to the bit line and whose source is connected to the ground,
    a second N type transistor having its drain connected to the supply terminal, its control gate connected to the bit line and its source connected to the control gate of the first transistor,
    a third N type transistor having its control gate connected to the control gate of the first transistor, its source connected to the ground and its drain connected to the reference line, and
    a first current source connected to the source of the second transistor to bias this second transistor;
    and wherein the inverter and non-inverter inputs of the differential amplifier are respectively connected to the bit line and to the reference line.

There is thus obtained a bit line precharging potential that is limited by the threshold voltage of the first transistor and the second transistor. If the second transistor is a native transistor, this borderline value of the precharging potential is approximately equal to 1 volt. A precharging potential of the same value is obtained on the reference line by the copying of the current. During the reading phase, the differential amplifier then carries out a comparison between the potential of the bit line and the potential of the reference line.

According to a second embodiment of the invention, the differential amplifier is connected differently. The means forming a current mirror and providing for a controlled precharging comprise:
    a first resistive element connected between a supply terminal and the bit line,
    a second resistive element connected between the supply terminal and the reference line,
    a first N type transistor having its drain connected to the bit line, its source connected to the ground and its control gate connected to the inverter input of the differential amplifier,
    a second N type transistor having its drain connected to the supply terminal, its control gate connected to the bit line and its source connected to the control gate of the first transistor,
    a third N type transistor having its control gate connected to the control gate of the first transistor, its source connected to the ground and its drain connected to the reference line,
    a fourth N type transistor having its drain connected to the supply terminal, its control gate connected to the reference line and its source connected to the non-inverter input of the differential amplifier, and
    a first current source and a second current source respectively connected to the source of the second and fourth transistors to bias these two transistors.

BRIEF DESCRIPTION OF THE DRAWINGS

Other features and advantages of the invention shall appear from the following detailed description, made with reference to the appended drawings, of which:

FIG. 1, already described, shows a prior art read circuit;

FIG. 2 shows a read circuit according to a first embodiment of the invention, and FIG. 3 shows a second embodiment of the read circuit according to the invention.

DETAILED DESCRIPTION OF THE PREFERRED EMBODIMENTS

The structure of the read circuit of FIG. 2 is relatively different from that of the circuit of FIG. 1. The device that limits the precharging potential is no longer interposed between the bit lines and a current mirror. Furthermore, the borderline value of the precharging potential is henceforth fixed with respect to the ground.

In FIG. 2, the bit line LB selected by the transistor TSLB is directly connected to the means forming a current mirror and also providing for a controlled precharging of the bit line LB and the reference line LR. The bit line LB is, therefore, connected to a resistor R1 which is connected, by its other end, to the supply terminal Vcc of the circuit. In an identical manner, the reference line LR is connected to a resistor R2 that is connected by its 15 other end to the supply terminal Vcc.

The bit line LB is also connected to a first arm of a current mirror formed by N type transistors TN1 and TN2. The reference line LR is connected to the second arm of the current mirror. The source of the transistor TN1 is connected to the ground. Its drain is connected firstly to the bit line LB and secondly to the control gate of the transistor TN2. Finally, its control gate is connected to the source of the transistor TN2, and the drain of the transistor TN2 is connected to the supply terminal Vcc. This first arm defines the reference arm of the current mirror. This current arm will enable the imposing of a borderline value on the precharging voltage equal to the sum of the threshold voltages of the transistors TN1 and TN2. Given that the threshold voltage of the transistor TN1 is in the range of 0.8 volts and that the threshold voltage of the transistor TN2 is 0.2 volts, a borderline value of 1 volt is obtained.

This arm, working together with the resistor R1, will also enable the production of a reference current that is copied in the second arm. During the precharging phase, the bit line LB is not connected to any memory cell CM. The resistor R1 and the transistor TN1 are then crossed by this reference current.

To provide stability for the threshold voltage of the transistor TN2, the drain of the transistor TN2 is connected to a current source SC1. The reference current flowing through the transistor TN1 during the precharging phase is copied into the second arm of this current mirror. In this example, the copying ratio of the current mirror that corresponds to the ratio between the geometries of the transistors is taken to be equal to one, and the resistors R1 and R2 have an identical value equal to R. Finally, the read circuit has a differential amplifier AD for the comparison, during the reading phase, of the potential of the bit line LB with the potential of the reference line LR. To this end, the inverter input of the amplifier is directly connected to the bit line LB, while the non-inverter input is connected to the reference line LR.

The circuit works as follows: during the precharging phase, the bit line LB is taken to a precharging potential equal to 1 volt by means of the transistors TN1 and TN2 and of the resistor. Since the current flowing in the resistor R1 is the same as the current flowing in the resistor R2, the reference line is precharged at the same potential.

During the reading phase, the selection of the memory cells, CM and CR, and the application of a read voltage to the control gate of the floating-gate transistors of these cells gives rise to two different effects depending on whether the cell CM is erased or programmed. If the cell CM is programmed, it counters the passage of a current. The potential of the bit line LB is then kept, while the potential of the reference line tends to fall to some extent for the reference cell is crossed by a reference current. The differential amplifier AD then switches over into a first state.

Conversely, if the cell CM is erased, it is crossed by a current greater than the current flowing in the reference cell CR. The potential of the bit line LB then tends to fall to a level lower than that of the potential of the reference line LR. The differential amplifier AD switches over into a reverse state.

One variant of this embodiment is described with reference to FIG. 3. The read circuit is complemented by an N type native transistor TN4 identical to the transistor TN2. Its control gate is connected to the reference line LR. Its drain is connected to the supply terminal Vcc and its source is connected to a current source SC2 identical to the source SC1. In this variant, the inverter input of the differential amplifier AD is connected to the source of the transistor TN2, and a non-inverter input is connected to the source of the transistor TN4. In this variant, the potentials present at the inputs of the amplifier AD are shifted by the value of the threshold voltage of the transistors TN2 and TN4 in comparison with the previous embodiment The general operation of the read circuit however remains the same.

That which is claimed is:

1. A non-volatile memory comprising:
    a matrix of memory cells;
    a reference current generator;
    at least one reference line;
    at least one bit line; and
    a read circuit connected, firstly, to said matrix of memory cells by said at least one bit line and, secondly, to said reference current generator by said at least one reference line, said read circuit comprising
        a differential amplifier for generating an output relating to a state of a memory cell, and
        a current mirror providing for a controlled precharging of the at least one bit line and of the at least one reference line while limiting the precharging potential to a predetermined threshold referenced with respect to ground.

2. The non-volatile memory according to claim 1, wherein said reference current generator comprises a reference memory cell.

3. The non-volatile memory according to claim 1, wherein said current mirror comprises:
    a first resistive element connected between a supply terminal and the at least one bit line;
    a second resistive element connected between the supply terminal and the at least one reference line;
    a first N type transistor having a drain connected to the at least one bit line and a source connected to ground;
    a second N type transistor having a drain connected to the supply terminal, a control gate connected to the at least one bit line, and a source connected to the control gate of the first N type transistor;
    a third N type transistor having a control gate connected to the control gate of the first N type transistor, a source connected to ground, and a drain connected to the at least one reference line; and
    a first current source connected to the source of the second N type transistor to bias same;
    said differential amplifier having inverted and non-inverted inputs respectively connected to the at least one bit line and to the at least one reference line.

4. The non-volatile memory according to claim 3, wherein the second N type transistor is a native transistor.

5. The non-volatile memory according to claim 3, wherein the first and second resistive elements have the same value; and wherein a ratio between geometries of the first and third N type transistors is equal to one.

6. The non-volatile memory according to claim 1, wherein said current mirror comprises:
    a first resistive element connected between a supply terminal and the at least one bit line;
    a second resistive element connected between the supply terminal and the at least one reference line;
    a first N type transistor having a drain connected to the at least one bit line, a source connected to ground, and a control gate connected to a first input of said differential amplifier;
    a second N type transistor having a drain connected to the supply terminal, a control gate connected to the at least one bit line, and a source connected to the control gate of the first N type transistor;
    a third N type transistor having a control gate connected to the control gate of the first N type transistor, a source connected to ground, and a drain connected to the at least one reference line;
    a fourth N type transistor having a drain connected to the supply terminal, a control gate connected to the at least one reference line, and a source connected to a second input of said differential amplifier; and
    a first current source and a second current source respectively connected to the source of the second and fourth N type transistors to bias these two transistors.

7. The non-volatile memory according to claim 6, wherein the first input of said differential amplifier is an inverted input, and the second input of said differential amplifier is a non-inverted input.

8. The non-volatile memory according to claim 6, wherein the second and fourth N type transistors are native transistors.

9. The non-volatile memory according to claim 6, wherein said first and second resistive elements have the same value; and wherein a ratio between geometries of the first and third N type transistors is substantially equal to one.

10. A read circuit for a non-volatile memory of a type comprising a matrix of memory cells, a reference current generator, at least one reference line, and at least one bit line; the read circuit being connected, firstly, to the matrix of memory cells by the at least one bit line and, secondly, to the reference current generator by the at least one reference line, the read circuit comprising:

a current mirror providing for a controlled precharging of the at least one bit line and of the at least one reference line while limiting the precharging potential to a predetermined threshold referenced with respect to ground.

11. The read circuit according to claim 10, wherein said current mirror comprises:

a first resistive element connected between a supply terminal and the at least one bit line;

a second resistive element connected between the supply terminal and the at least one reference line;

a first N type transistor having a drain connected to the at least one bit line and a source connected to ground;

a second N type transistor having a drain connected to the supply terminal, a control gate connected to the at least one bit line, and a source connected to the control gate of the first N type transistor;

a third N type transistor having a control gate connected to the control gate of the first N type transistor, a source connected to ground, and a drain connected to the at least one reference line; and a first current source connected to the source of the second N type transistor to bias same.

12. The read circuit according to claim 11, wherein the second N type transistor is a native transistor.

13. The read circuit according to claim 11, wherein the first and second resistive elements have the same value; and wherein a ratio between geometries of the first and third N type transistors is equal to one.

14. The read circuit according to claim 10, further comprising a differential amplifier having inverted and non-inverted inputs respectively connected to the at least one bit line and to the at least one reference line.

15. The read circuit according to claim 14, wherein said current mirror comprises:

a first resistive element connected between a supply terminal and the at least one bit line;

a second resistive element connected between the supply terminal and the at least one reference line;

a first N type transistor having a drain connected to the at least one bit line, a source connected to ground, and a control gate connected to the inverted input of said differential amplifier;

a second N type transistor having a drain connected to the supply terminal, a control gate connected to the at least one bit line, and a source connected to the control gate of the first N type transistor;

a third N type transistor having a control gate connected to the control gate of the first N type transistor, a source connected to ground, and a drain connected to the at least one reference line;

a fourth N type transistor having a drain connected to the supply terminal, a control gate connected to the at least one reference line, and a source connected to the non-inverted input of said differential amplifier; and a first current source and a second current source respectively connected to the source of the second and fourth N type transistors to bias these two transistors.

16. The read circuit according to claim 15, wherein the second and fourth N type transistors are native transistors.

17. The read circuit according to claim 15, wherein said first and second resistive elements have the same value; and wherein a ratio between geometries of the first and third N type transistors is substantially equal to one.

18. A read circuit for a non-volatile memory of a type comprising a matrix of memory cells, a reference current generator, at least one reference line, and at least one bit line; the read circuit being connected, firstly, to the matrix of memory cells by the at least one bit line and, secondly, to the reference current generator by the at least one reference line, the read circuit comprising:

a current mirror providing for a controlled precharging of the at least one bit line and of the at least one reference line while limiting the precharging potential to a predetermined threshold referenced with respect to ground, said current mirror comprising a first resistive element connected between a supply terminal and the at least one bit line, and a second resistive element connected between the supply terminal and the at least one reference line.

19. The read circuit according to claim 18, wherein said current mirror further comprises:

a first N type transistor having a drain connected to the at least one bit line and a source connected to ground;

a second N type transistor having a drain connected to the supply terminal, a control gate connected to the at least one bit line, and a source connected to the control gate of the first N type transistor;

a third N type transistor having a control gate connected to the control gate of the first N type transistor, a source connected to ground, and a drain connected to the at least one reference line; and a first current source connected to the source of the second N type transistor to bias same.

20. The read circuit according to claim 19, wherein the second N type transistor is a native transistor.

21. The read circuit according to claim 19, wherein the first and second resistive elements have the same value; and wherein a ratio between geometries of the first and third N type transistors is equal to one.

22. The read circuit according to claim 18, further comprising a differential amplifier having inverted and non-inverted inputs respectively connected to the at least one bit line and to the at least one reference line.

23. The read circuit according to claim 22, wherein said current mirror further comprises:

a first resistive element connected between a supply terminal and the at least one bit line;

a second resistive element connected between the supply terminal and the at least one reference line;

a first N type transistor having a drain connected to the at least one bit line, a source connected to ground, and a control gate connected to the inverted input of said differential amplifier;

a second N type transistor having a drain connected to the supply terminal, a control gate connected to the at least one bit line, and a source connected to the control gate of the first N type transistor;

a third N type transistor having a control gate connected to the control gate of the first N type transistor, a source connected to ground, and a drain connected to the at least one reference line;

a fourth N type transistor having a drain connected to the supply terminal, a control gate connected to the at least one reference line, and a source connected to the non-inverted input of said differential amplifier; and a first current source and a second current source respectively connected to the source of the second and fourth N type transistors to bias these two transistors.

24. The read circuit according to claim 23, wherein the second and fourth N type transistors are native transistors.

25. The read circuit according to claim 23, wherein said first and second resistive elements have the same value; and wherein a ratio between geometries of the first and third N type transistors is substantially equal to one.

26. A method for reading a non-volatile memory of a type comprising a matrix of memory cells, a reference current generator, at least one reference line, and at least one bit line; the read circuit being connected, firstly, to the matrix of memory cells by the at least one bit line and, secondly, to the reference current generator by the at least one reference line, the method comprising the steps of:

forming a current mirror providing for a controlled precharging of the at least one bit line and of the at least one reference line while limiting the precharging potential to a predetermined threshold referenced with respect to ground.

27. The method according to claim 26 wherein the step of forming a current mirror comprises the steps of connecting a first resistive element between a supply terminal and the at least one bit line; and connecting a second resistive element between the supply terminal and the at least one reference line.

* * * * *